(12) United States Patent
Chang et al.

(10) Patent No.: US 9,443,951 B2
(45) Date of Patent: Sep. 13, 2016

(54) EMBEDDED PLANAR SOURCE/DRAIN STRESSORS FOR A FINFET INCLUDING A PLURALITY OF FINS

(71) Applicant: GLOBALFOUNDRIES INC., Grand Cayman (KY)

(72) Inventors: Josephine B. Chang, Bedford Hills, NY (US); Paul Chang, Mahopac, NY (US); Michael A. Guillorn, Yorktown Heights, NY (US); Jeffrey W. Sleight, Ridgefield, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 75 days.

(21) Appl. No.: 14/076,387

(22) Filed: Nov. 11, 2013

(65) Prior Publication Data
US 2014/0065774 A1    Mar. 6, 2014

Related U.S. Application Data

(62) Division of application No. 13/483,200, filed on May 30, 2012, now Pat. No. 9,024,355.

(51) Int. Cl.
*H01L 29/66* (2006.01)
*H01L 29/78* (2006.01)
(Continued)

(52) U.S. Cl.
CPC ....... *H01L 29/66484* (2013.01); *H01L 21/845* (2013.01); *H01L 27/1211* (2013.01);
(Continued)

(58) Field of Classification Search
CPC .................. H01L 21/02381; H01L 21/02505; H01L 21/0254; H01L 29/0847; H01L 29/513; H01L 29/517; H01L 29/66484; H01L 29/6659; H01L 29/66636; H01L 29/66795; H01L 29/78; H01L 29/7831; H01L 29/785; H01L 29/78645; H01L 33/007

USPC ....... 257/190, E21.421, E29.255, 20, 76, 77, 257/368, 613; 977/936, 938, 734, 742, 749, 977/755, 815, 843, 855
See application file for complete search history.

(56) References Cited

U.S. PATENT DOCUMENTS 6,413,802 B1    7/2002 Hu et al.
6,815,738 B2    11/2004 Rim
(Continued)

OTHER PUBLICATIONS

Office Action dated Aug. 18, 2014 received in U.S. Appl. No. 13/483,200.
(Continued)

*Primary Examiner* — Ori Nadav
*Assistant Examiner* — Ernest Allen, III
(74) *Attorney, Agent, or Firm* — Scully, Scott, Murphy & Presser, P.C.

(57) ABSTRACT

Fin-defining mask structures are formed over a semiconductor material layer having a first semiconductor material and a disposable gate structure is formed thereupon. A gate spacer is formed around the disposable gate structure and physically exposed portions of the fin-defining mask structures are subsequently removed. The semiconductor material layer is recessed employing the disposable gate structure and the gate spacer as an etch mask to form recessed semiconductor material portions. Embedded planar source/drain stressors are formed on the recessed semiconductor material portions by selective deposition of a second semiconductor material having a different lattice constant than the first semiconductor material. After formation of a planarization dielectric layer, the disposable gate structure is removed. A plurality of semiconductor fins are formed employing the fin-defining mask structures as an etch mask. A replacement gate structure is formed on the plurality of semiconductor fins.

14 Claims, 16 Drawing Sheets

(51) Int. Cl.
*H01L 21/84* (2006.01)
*H01L 27/12* (2006.01)

(52) U.S. Cl.
CPC ....... *H01L29/66795* (2013.01); *H01L 29/785* (2013.01); *H01L 29/7831* (2013.01); *H01L 29/7848* (2013.01)

(56) References Cited

U.S. PATENT DOCUMENTS

| | | | |
|---|---|---|---|
| 7,314,802 B2 | 1/2008 | Zhu et al. | |
| 7,655,511 B2 | 2/2010 | Chidambarrao | |
| 7,737,498 B2 | 6/2010 | Chatty et al. | |
| 7,872,303 B2 | 1/2011 | Chan et al. | |
| 7,915,685 B2 | 3/2011 | Cohen | |
| 7,993,988 B2 | 8/2011 | Juengling | |
| 8,039,349 B2 | 10/2011 | Hargrove et al. | |
| 2005/0145941 A1 | 7/2005 | Bedell et al. | |
| 2007/0148837 A1 | 6/2007 | Shah et al. | |
| 2009/0061572 A1* | 3/2009 | Hareland | H01L 29/42384 438/157 |
| 2010/0038679 A1* | 2/2010 | Chan | H01L 29/66795 257/190 |
| 2010/0155842 A1* | 6/2010 | Anderson | H01L 29/66795 257/347 |
| 2011/0073951 A1 | 3/2011 | Chatty et al. | |
| 2011/0284967 A1 | 11/2011 | Cheng et al. | |

OTHER PUBLICATIONS

Office Action dated Jan. 17, 2014 received in a related U.S. Patent Application, namely U.S. Appl. No. 13/483,200.

* cited by examiner

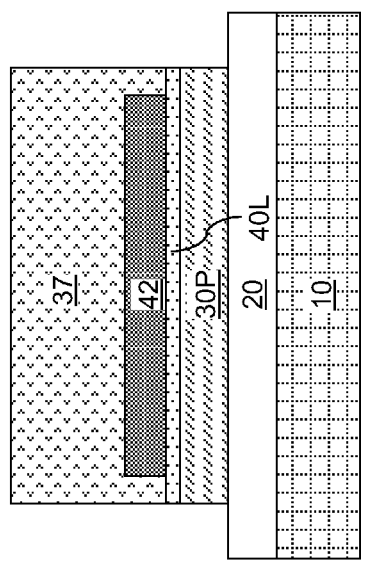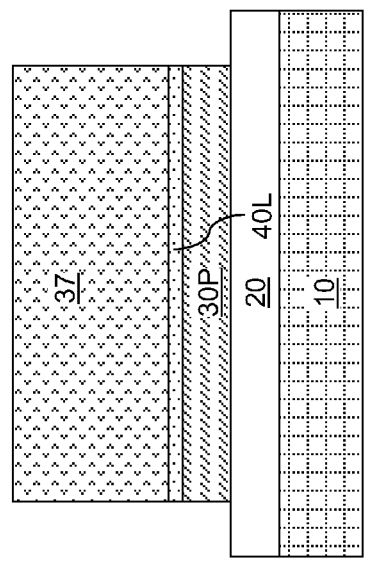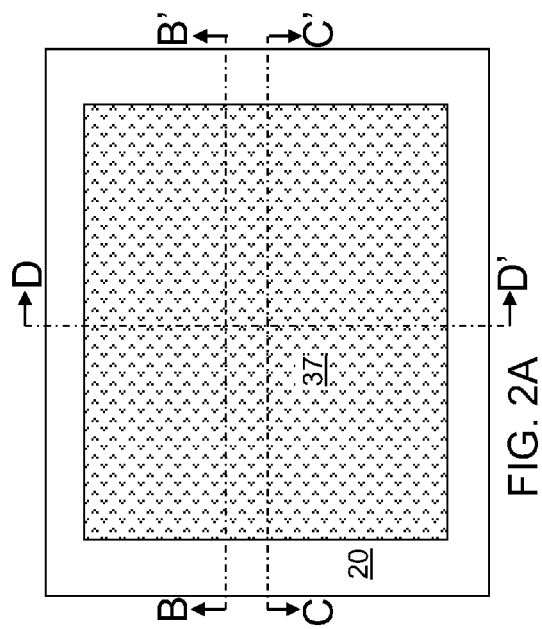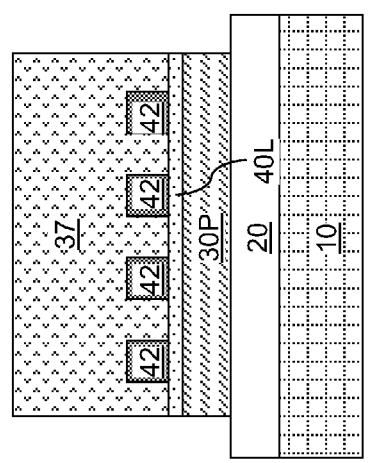

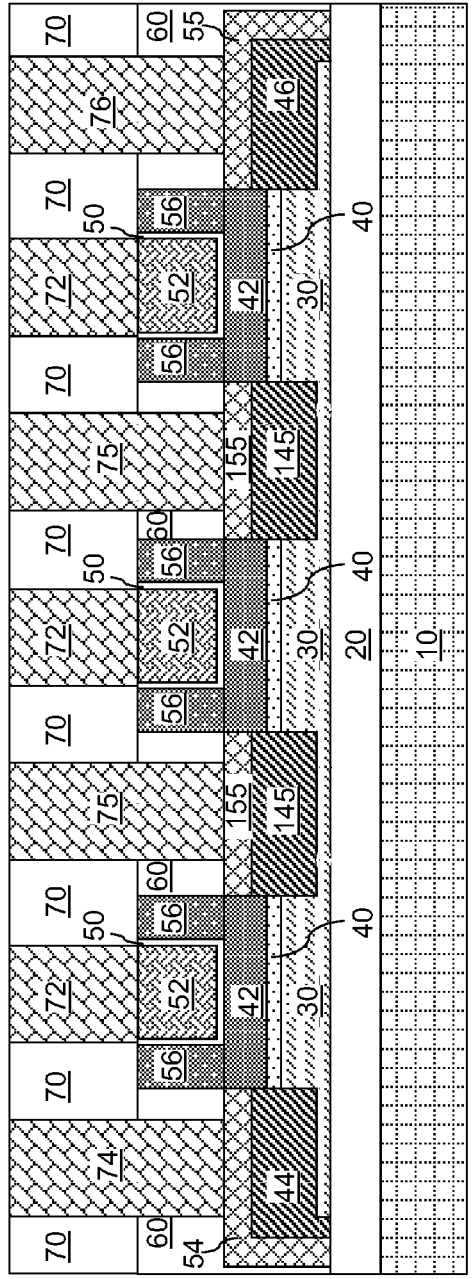
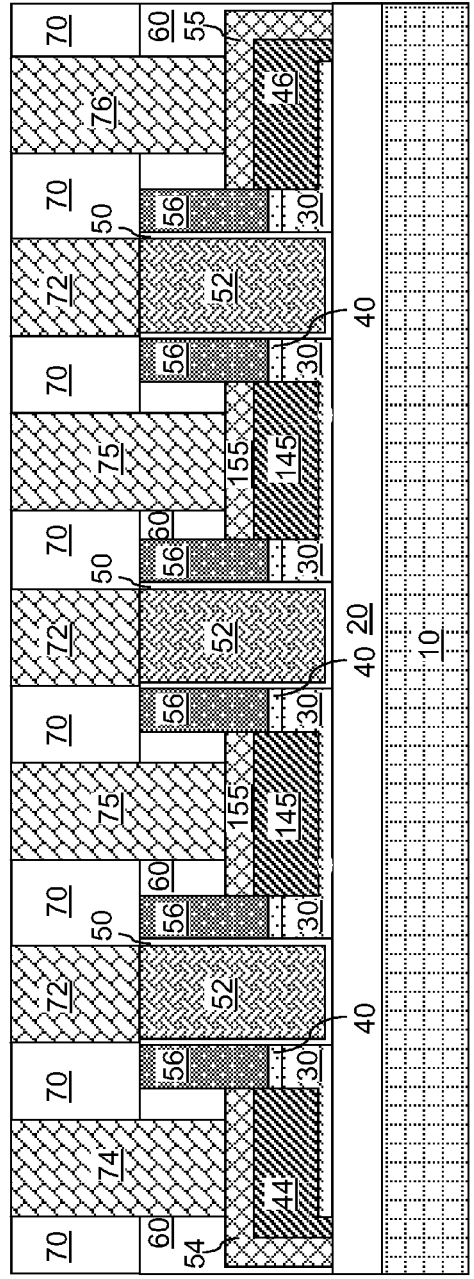
FIG. 18A
FIG. 18B

EMBEDDED PLANAR SOURCE/DRAIN STRESSORS FOR A FINFET INCLUDING A PLURALITY OF FINS

CROSS REFERENCE TO RELATED APPLICATION

This application is a divisional of U.S. patent application Ser. No. 13/483,200, filed May 30, 2012, the entire content and disclosure of which are incorporated herein by reference.

BACKGROUND

The present disclosure relates to a semiconductor structure, and particularly to a finFET transistor including embedded planar source/drain stressors and a method of manufacturing the same.

Various attempts have been made to introduce stress to the channel of a fin field effect transistor (finFET) without much success. For example, wrapping a stressor material on both ends of a rectangular parallelepiped shaped semiconductor fin of a finFET has not been successful in providing a stress to the channel because the stress is applied to the source region or to the drain region within the wrapped semiconductor material along the direction perpendicular to the direction of the channel. While merging of multiple source regions or multiple drain regions of a plurality of parallel semiconductor fins with selective epitaxy is also known, raised source/drain regions formed by epitaxial merging of multiple source/drain regions are structurally non-uniform and not fully single crystalline, providing complications and process variations during further processing due to the non-uniformity and seams between multiple single crystalline portions.

SUMMARY

Fin-defining mask structures are formed over a semiconductor material layer having a first semiconductor material and a disposable gate structure is formed thereupon. A gate spacer is formed around the disposable gate structure and physically exposed portions of the fin-defining mask structures are subsequently removed. The semiconductor material layer is recessed employing the disposable gate structure and the gate spacer as an etch mask to form recessed semiconductor material portions. Embedded planar source/drain stressors are formed on the recessed semiconductor material portions by selective deposition of a second semiconductor material having a different lattice constant than the first semiconductor material. After formation of a planarization dielectric layer, the disposable gate structure is removed. A plurality of semiconductor fins are formed employing the fin-defining mask structures as an etch mask. A replacement gate structure is formed on the plurality of semiconductor fins.

According to an aspect of the present disclosure, a semiconductor structure includes a fin-containing semiconductor portion. The fin-containing semiconductor portion includes a first semiconductor material and including a plurality of semiconductor fins, a first end portion, and a second end portion. Each semiconductor fin among the plurality of semiconductor fins is laterally spaced from each other or one another along a widthwise direction. A lengthwise end of each of the plurality of semiconductor fins is adjoined to the first end portion and another lengthwise end of each of the plurality of semiconductor fins is adjoined to the second end portion. Each of the first end portion and the second end portion includes a proximal portion having a same height as the plurality of semiconductor fins and a distal portion having a lesser height than the plurality of semiconductor fins. The semiconductor structure further includes a first stress-generating semiconductor portion, which is in contact with a sidewall of the proximal portion of the first end portion and includes a second semiconductor material having a different lattice constant than the first semiconductor material and epitaxially aligned to the first end portion. Yet further, the semiconductor structure includes a second stress-generating semiconductor portion in contact with a sidewall of the proximal portion of the second end portion. The second stress-generating semiconductor portion includes the second semiconductor material and is epitaxially aligned to the second end portion.

In one embodiment, a plurality of fin-defining mask structures overlies the plurality of semiconductor fins, and the plurality of semiconductor fins has a same width as the plurality of fin-defining mask structures.

According to yet another aspect of the present disclosure, a method of forming a semiconductor structure is provided. A plurality of fin-defining mask structures is formed over a semiconductor material layer including a first semiconductor material. A disposable gate structure and a gate spacer are formed over middle portions of the plurality of fin-defining mask structures. Portions of the semiconductor material layer that are not covered by the disposable gate structure or by the gate spacer are recessed. A first stress-generating semiconductor portion and a second stress-generating semiconductor portion are formed, which include a second semiconductor material that is different from the first semiconductor material on the recessed portions of the semiconductor material layer. The disposable gate structure is removed to form a gate cavity. A plurality of semiconductor fins is formed by transferring a pattern of the plurality of fin-defining mask structures within the gate cavity into the remaining portion of the semiconductor material layer.

BRIEF DESCRIPTION OF SEVERAL VIEWS OF THE DRAWINGS

FIG. 2A is a top-down view of the first exemplary semiconductor structure after patterning of a semiconductor material layer according to an embodiment of the present disclosure.

FIG. 2B is a vertical cross-sectional view of the first exemplary semiconductor structure along the vertical plane B-B' of FIG. 2A.

FIG. 2C is a vertical cross-sectional view of the first exemplary semiconductor structure along the vertical plane C-C' of FIG. 2A.

FIG. 2D is a vertical cross-sectional view of the first exemplary semiconductor structure along the vertical plane D-D' of FIG. 2A.

FIG. 18A is a first vertical cross-sectional view of the second exemplary semiconductor structure after formation of various contact via structures along a vertical plane that is equivalent to the vertical plane B-B' of FIG. 13A according to an embodiment of the present disclosure.

FIG. 18B is a second vertical cross-sectional view of the second exemplary semiconductor structure after formation of various contact via structures along a vertical plane that is equivalent to the vertical plane C-C' of FIG. 13A according to an embodiment of the present disclosure.

DETAILED DESCRIPTION

Figure 1B:
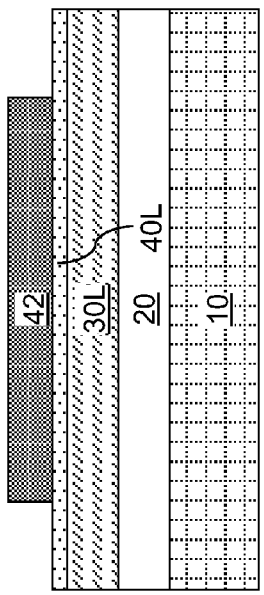
FIG. 1B is a vertical cross-sectional view of the first exemplary semiconductor structure along the vertical plane B-B' of FIG. 1A.
Figure 1C:
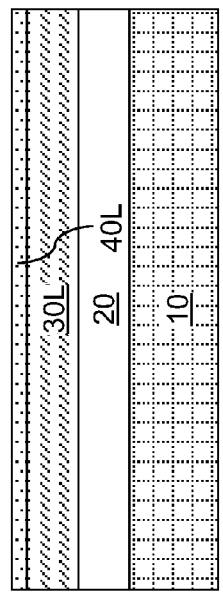
FIG. 1C is a vertical cross-sectional view of the first exemplary semiconductor structure along the vertical plane C-C' of FIG. 1A.
Figure 1A:
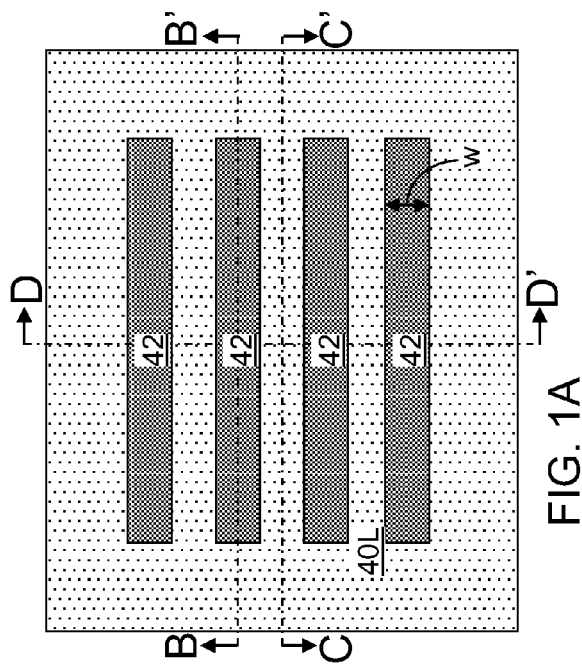
FIG. 1A is a top-down view of a first exemplary semiconductor structure after formation of an optional dielectric cap layer and a plurality of fin-defining mask structures according to an embodiment of the present disclosure.
Figure 1D:
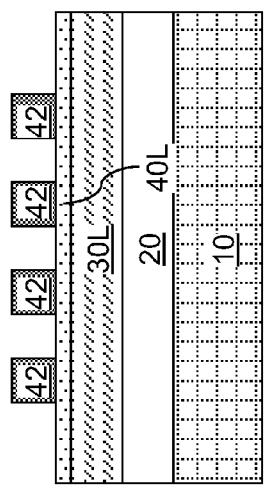
FIG. 1D is a vertical cross-sectional view of the first exemplary semiconductor structure along the vertical plane D-D' of FIG. 1A.
Figure 3A:
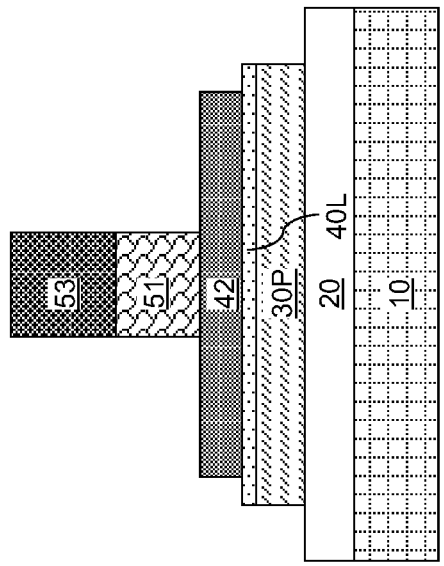
FIG. 3A is a top-down view of the first exemplary semiconductor structure after formation of a disposable gate structure and a disposable gate cap according to an embodiment of the present disclosure.
Figure 3B:
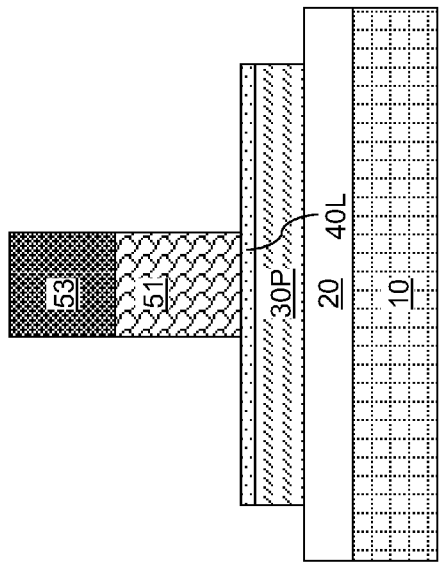
FIG. 3B is a vertical cross-sectional view of the first exemplary semiconductor structure along the vertical plane B-B' of FIG. 3A.
Figure 3C:
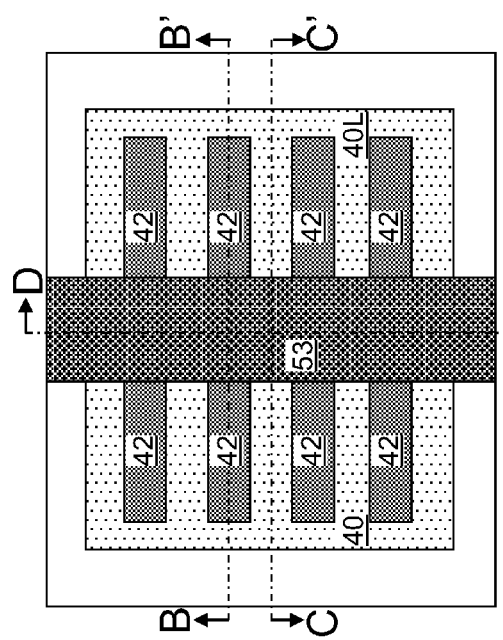
FIG. 3C is a vertical cross-sectional view of the first exemplary semiconductor structure along the vertical plane C-C' of FIG. 3A.
Figure 3D:
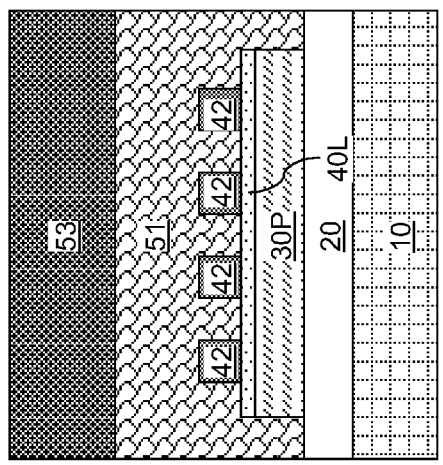
FIG. 3D is a vertical cross-sectional view of the first exemplary semiconductor structure along the vertical plane D-D' of FIG. 3A.
Figure 4A:
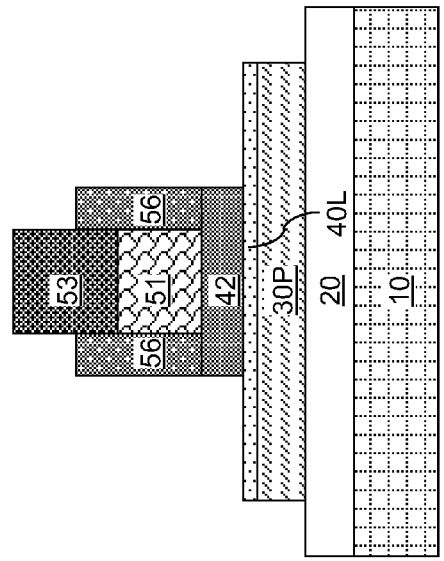
FIG. 4A is a top-down view of the first exemplary semiconductor structure after formation of a gate spacer and removal of portions of the plurality of fin-defining mask structures that are not covered by the disposable gate structure or by the gate spacer according to an embodiment of the present disclosure.
Figure 4B:
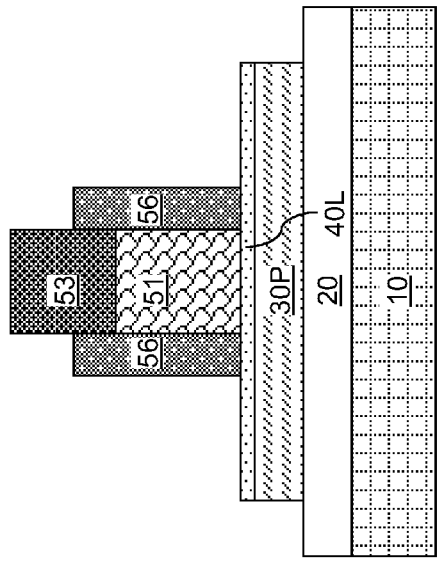
FIG. 4B is a vertical cross-sectional view of the first exemplary semiconductor structure along the vertical plane B-B' of FIG. 4A.
Figure 4D:
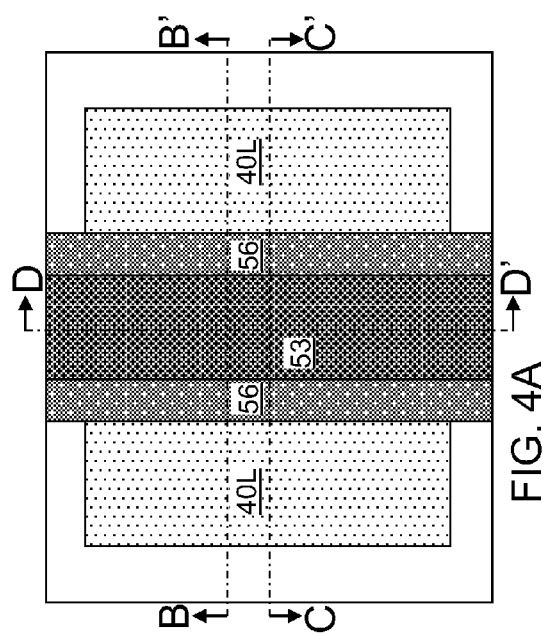
FIG. 4D is a vertical cross-sectional view of the first exemplary semiconductor structure along the vertical plane D-D' of FIG. 4A.
Figure 4C:
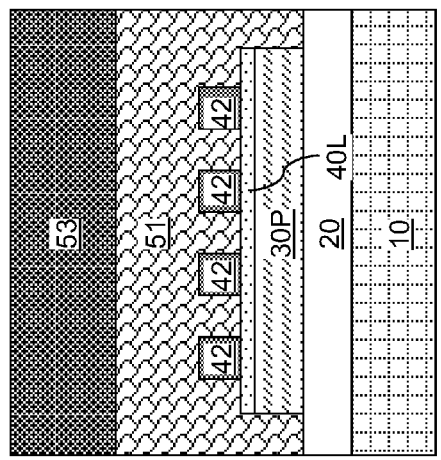
FIG. 4C is a vertical cross-sectional view of the first exemplary semiconductor structure along the vertical plane C-C' of FIG. 4A.

As stated above, the present disclosure relates to a finFET transistor including embedded planar source/drain stressors and a method of manufacturing the same. Aspects of the present disclosure are now described in detail with accompanying figures. It is noted that like reference numerals refer to like elements across different embodiments. The drawings are not necessarily drawn to scale.

Referring to FIGS. 1A, 1B, 1C, and 1D, a first exemplary semiconductor structure according to an embodiment of the present disclosure includes a semiconductor-on-insulator (SOI) substrate. The SOI substrate can include a stack, from bottom to top, of a handle substrate 10, a buried insulator layer 20, and a top semiconductor layer 30L.

The handle substrate 10 can include a semiconductor material, a conductive material, and/or a dielectric material. The handle substrate 10 provides mechanical support to the buried insulator layer 20 and the top semiconductor layer 30L. The thickness of the handle substrate 10 can be from 30 microns to 2 mm, although lesser and greater thicknesses can also be employed.

The buried insulator layer 20 includes a dielectric material such as silicon oxide, silicon nitride, silicon oxynitride, or a combination thereof. The thickness of the buried insulator layer 20 can be from 50 nm to 5 microns, although lesser and greater thicknesses can also be employed.

The top semiconductor layer 30L is a semiconductor material layer including a first semiconductor material. The first semiconductor material can be an elemental semiconductor material or a compound semiconductor material. For example, the first semiconductor material can be silicon, germanium, a silicon-germanium alloy, or a silicon-carbon alloy. The first semiconductor material may or may not be doped with p-type dopants and/or n-type dopants. The first semiconductor material can be a single crystalline semiconductor material, a polycrystalline semiconductor material, or an amorphous semiconductor material. In one embodiment, the first semiconductor material can be silicon. In one embodiment, the first semiconductor material can be single crystalline silicon. The thickness of the top semiconductor layer 30L can be from 10 nm to 500 nm, although lesser and greater thicknesses can also be employed.

An optional dielectric pad layer 40L can be formed on the top surface of the top semiconductor layer 30L. The optional dielectric pad layer 40L includes a dielectric material, which can be, for example, silicon oxide, silicon oxynitride, a dielectric metal oxide, or a combination thereof. The optional dielectric pad layer 40L can be formed, for example, by chemical vapor deposition (CVD) or conversion of a topmost portion of the top semiconductor layer 30L by thermal oxidation, thermal nitridation, plasma oxidation, plasma nitridation, or a combination thereof. The thickness of the optional dielectric pad layer 40L can be from 1 nm to 20 nm, although lesser and greater thicknesses can also be employed.

A plurality of fin-defining mask structures 42 can be formed over the top semiconductor layer 30L. The plurality of fin-defining mask structures 42 can be formed directly on the optional dielectric pad layer 40L, if present. The plurality of fin-defining mask structures 42 are mask structures that cover the regions of the top semiconductor layer 30L that are subsequently converted into semiconductor fins. Thus, the plurality of fin-defining mask structures 42 are subsequently employed to define the area of the semiconductor fins. The plurality of fin-defining mask structures 42 can include a dielectric material such as silicon nitride, silicon oxide, and silicon oxynitride.

The plurality of fin-defining mask structures 42 can be formed, for example, by depositing a planar dielectric material layer and lithographically patterning the dielectric material layer. The planar dielectric material layer can be deposited, for example, by chemical vapor deposition (CVD). The thickness of the planar dielectric material layer can be from 5 nm to 100 nm, although lesser and greater thicknesses can also be employed.

The planar dielectric material layer can be subsequently patterned to form the plurality of fin-defining mask structures 42. In on embodiment, each fin-defining mask structure 42 in the plurality of fin-defining mask structures 42 can laterally extend along a lengthwise direction (e.g., the horizontal direction within the B-B' plane or the C-C' plane). Further, each fin-defining mask structure 42 in the plurality of fin-defining mask structures 42 can have a pair of sidewalls that are separated along a widthwise direction, which is perpendicular to the lengthwise direction. In one embodiment, each fin-defining mask structure 42 in the plurality of fin-defining mask structures 42 can have a rectangular horizontal cross-sectional area. In one embodiment, the fin-defining mask structures 42 in the plurality of fin-defining mask structures 42 can have the same width w.

Referring to FIGS. 2A, 2B, 2C, and 2D, a photoresist layer 37 can be applied over the plurality of fin-defining mask structures 42. The photoresist layer 37 can subsequently patterned to cover an area overlying a portion or the entirety of the plurality of fin-defining mask structures 42.

Any portions of the fin-defining mask structures which lie outside the photoresist layer 37 may be removed, and the pattern in the photoresist layer 37 is transferred into the optional dielectric pad layer 40L and the top semiconductor layer 30L by an etch. The etch can be an anisotropic etch or an isotropic etch. In one embodiment, the etch can be a reactive ion etch, which is an anisotropic etch. In one embodiment, the etch can be selective to the dielectric material of the buried insulator layer 20. A remaining portion of the top semiconductor layer 30L after the pattern transfer from the photoresist layer 37 through the top semiconductor layer 30L is herein referred to as a patterned semiconductor material layer 30P.

Referring to FIGS. 3A, 3B, 3C, and 3D, a disposable gate structure 51 and a disposable gate cap 53 can be formed. The disposable gate structure 51 and the disposable gate cap 53 can be formed, for example, by depositing a disposable gate material layer (not shown) and a disposable gate cap layer (not shown), and subsequently lithographically patterning the disposable gate material layer and the disposable gate cap layer. A remaining portion of the disposable gate material layer after the lithographic patterning constitutes the disposable gate structure 51, and a remaining portion of the disposable gate cap layer after the lithographic patterning constitutes the disposable gate cap 53.

The disposable gate material layer includes a material that can be removed selective to the material of the plurality of fin-defining mask structures 42 and selective to material of the optional dielectric pad layer 40L if the optional dielectric pad layer 40L is present. In this case, the disposable gate material layer can include a semiconductor material, a dielectric material that is different from the dielectric material of the optional dielectric cap pad layer 40L, or a metallic material. Exemplary semiconductor materials that can be employed for the disposable gate material layer include silicon, germanium, a silicon germanium alloy, a silicon carbon alloy, a compound semiconductor material, or a combination thereof. The disposable gate material layer can be deposited, for example, by chemical vapor deposition (CVD). The thickness of the disposable gate material layer, as measured above a planar surface, can be from 50 nm to 600 nm, although lesser and greater thicknesses can also be employed.

The disposable gate material layer includes a material that can be removed selective to the material of the plurality of fin-defining mask structures 42 and selective to the material of the patterned semiconductor material layer 30P if the optional dielectric pad layer 40L is not present. In this case, the disposable gate material layer can include a semiconductor material that is different from the first semiconductor material (i.e., the semiconductor material of the patterned semiconductor material layer 30P), a dielectric material, or a metallic material. Exemplary semiconductor materials that can be employed for the disposable gate material layer include silicon, germanium, a silicon germanium alloy, a silicon carbon alloy, a compound semiconductor material, or a combination thereof. The disposable gate material layer can be deposited, for example, by chemical vapor deposition (CVD). The thickness of the disposable gate material layer, as measured above a planar surface, can be from 50 nm to 600 nm, although lesser and greater thicknesses can also be employed. In one embodiment, the first semiconductor material can be silicon, and the material of the disposable gate material layer can be germanium, a silicon germanium alloy, undoped silicon oxide, doped silicon oxide, or a combination thereof.

The disposable gate cap layer includes a material that can be employed as an etch mask for subsequently etching the patterned semiconductor material layer 30P. For example, the disposable gate cap layer can include silicon nitride, silicon oxide, silicon oxynitride, or a combination thereof. The thickness of the disposable gate cap layer can be from 20 nm to 300 nm, although lesser and greater thicknesses can also be employed. In one embodiment, the disposable gate cap layer can include the same material as the material of the plurality of fin-defining mask structures 42. In this case, the thickness of the disposable gate cap layer can be greater than the height (thickness) of the plurality of fin-defining mask structures 42. In one embodiment, the plurality of fin-defining mask structures 42 and the disposable gate cap layer can include silicon nitride.

A photoresist layer (not shown) can be applied over the stack, from bottom to top, of the disposable gate material layer and the disposable gate cap layer. The photoresist layer can be subsequently patterned into gate patterns, which are typically a plurality of lines which run perpendicular to and intersect the plurality of fin-defining mask structures 42. Physically exposed portions of the disposable gate material layer and the disposable gate cap layer, i.e., portions of the disposable gate material layer and the disposable gate cap layer that are not covered by the patterned photoresist layer, are removed, for example, by an etch, which can be an anisotropic etch. The etch that removes physically exposed portions of the disposable gate material layer and the disposable gate cap layer can be selective to the materials of the plurality of fin-defining mask structures 42. If the optional dielectric pad layer 40L is present, the etch that removes physically exposed portions of the disposable gate material layer and the disposable gate cap layer can be selective to the materials of the optional dielectric pad layer 40. If the optional dielectric pad layer 40L is not present, the etch that removes physically exposed portions of the disposable gate material layer and the disposable gate cap layer can be selective to the first semiconductor material of the patterned semiconductor material layer 30P. The stack of the disposable gate structure 51 and the disposable gate cap 53 straddles over middle portions of the plurality of fin-defining mask structures 42.

In one embodiment, the portions of the patterned semiconductor material layer 30P that do not underlie the stack of the disposable gate structure 51 and the disposable gate cap 53 can be doped with dopants to form a source region (not shown) and a drain region (not shown).

Referring to FIGS. 4A, 4B, 4C, and 4D, a gate spacer 56 can be formed on sidewalls of the stack of the disposable gate structure 51 and the disposable gate cap 53. A conformal dielectric material layer (not shown) can be deposited on the stack of the disposable gate structure 51 and the disposable gate cap 53 and over the plurality of fin-defining mask structures 42, for example, by chemical vapor deposition (CVD) or atomic layer deposition (ALD). The conformal dielectric material layer includes a dielectric material such as silicon nitride, silicon oxide, a dielectric metal oxide, or a combination thereof. The thickness of the conformal dielectric material layer can be from 3 nm to 100 nm, although lesser and greater thicknesses can also be employed.

The dielectric material of the conformal dielectric material layer may, or may not be, the same as the dielectric material of the plurality of fin-defining mask structures 42. In one embodiment, the dielectric material of the conformal dielectric material layer can be the same as the dielectric material of the plurality of fin-defining mask structures 42. In one embodiment, the dielectric material of the conformal dielectric material layer and the dielectric material of the plurality of fin-defining mask structures 42 can be silicon nitride.

Vertical portions of the conformal dielectric material layer are subsequently etched by an anisotropic etch to form the gate spacer 56. The anisotropic etch that forms the gate spacer 56 can be selective to the material of the optional dielectric pad layer 40L if the optional dielectric pad layer 40L is present. The anisotropic etch that forms the gate spacer 56 can be selective to the first semiconductor material of the patterned semiconductor material layer 30P if the optional dielectric pad layer 40L is not present.

Further, portions of the plurality of fin-defining mask structures 42 that are not covered by the disposable gate structure 51 or by vertical portions of the conformal dielectric material layer, i.e., the portions of the conformal dielectric material layer that become the gate spacer 56, are etched by a subsequent etch, which may employ the same etch chemistry as the etch that forms the gate spacer 56, or may employ a different etch chemistry. The subsequent etch can be selective to the material of the optional dielectric pad layer 40L if the optional dielectric pad layer 40L is present. The subsequent etch can be selective to the first semiconductor material of the patterned semiconductor material layer 30P if the optional dielectric pad layer 40L is not present. The subsequent etch can be an anisotropic etch, or can be an isotropic etch. Thus, portions of the plurality of fin-defining mask structures 42 that are not covered by the disposable gate structure 51 or by the gate spacer 56 are removed by the end of the subsequent etch.

Referring to FIGS. 5A, 5B, 5C, and 5D, portions of the optional dielectric pad layer 40L can be removed by an etch, which can be an anisotropic etch or an isotropic etch. The remaining portion of the optional dielectric pad layer 40L is herein referred to as an optional dielectric pad 40. The optional dielectric pad 40 underlies the plurality of fin-defining mask structures 42, the disposable gate structure 51, and the gate spacer 56.

Subsequently, portions of the patterned semiconductor material layer 30P that are not covered by the disposable gate structure 51 or by the gate spacer 56 are recessed. In one embodiment, an anisotropic etch may be used. The anisotropic etch may remove the first semiconductor material of the patterned semiconductor material layer 30P selective to the materials of the disposable gate cap 53 and the gate spacer 56. In another embodiment, a crystallographic etch may be used to create a sigma-shaped recess.

Each of the recessed portions of the patterned semiconductor material layer 30P includes a sidewall 30V that is aligned with a sidewall of the gate spacer 56. One of the two sidewalls 30V is herein referred to as a first sidewall, and the other of the two sidewalls 30V is herein referred to as a second vertical sidewall.

Further, each of the recessed portions of the patterned semiconductor material layer 30P has a bottom recessed surface 30S that is located below the horizontal plane of the topmost surface of the patterned semiconductor material layer 30P and above an interface between the patterned semiconductor material layer 30P and the buried insulator layer 20. In one embodiment, each bottom recessed surface 30S can overlie an entirety of one of the recessed portions of the patterned semiconductor material layer 30P.

Referring to FIGS. 6A, 6B, 6C, and 6D, a second semiconductor material can be deposited on semiconductor surfaces of the patterned semiconductor material layer 30P by a selective deposition method. The selective deposition method can be, for example, selective epitaxy. The second semiconductor material is different from the first semiconductor material. In one embodiment, the first semiconductor material of the patterned semiconductor material layer 30P can be single crystalline, and the second semiconductor material can be a material that can be epitaxially deposited on the single crystalline first semiconductor material to form epitaxial second semiconductor material portions.

In one embodiment, the second semiconductor material is lattice-mismatched with respect to the single crystalline first semiconductor material of the patterned semiconductor material layer 30P, i.e., have a different lattice constant than the lattice constant of the first semiconductor material. For example, the first semiconductor material can be silicon, and the second semiconductor material can be a silicon-germanium alloy or a silicon-carbon alloy.

During the selective deposition, the second semiconductor material is deposited on semiconductor surfaces, i.e., the physically exposed surfaces of the patterned semiconductor material layer 30P, while the second semiconductor material is not deposited on dielectric surfaces such as the surfaces of the disposable gate cap 53, the gate spacer 56, and the plurality of fin-defining mask structures 42.

The epitaxial second semiconductor material portions formed on the two recessed portions of the patterned semiconductor material layer 30P applies stress along a lengthwise direction of the patterned semiconductor material layer 30P. Thus, the epitaxial second semiconductor material portions are herein referred to as stress-generating semiconductor material portions (44, 46). The lengthwise direction of the patterned semiconductor material layer 30P is the horizontal direction connecting a center portion of a first recessed portion of the patterned semiconductor material layer 30P and a center portion of a second recessed portion of the patterned semiconductor material layer 30P. The lengthwise direction of the patterned semiconductor material layer 30P can be the same as the lengthwise direction of the plurality of fin-defining mask structures 42.

The stress-generating semiconductor material portions (44, 46) include a first stress-generating semiconductor material portion 44 that is formed on one of the two recessed portions of the patterned semiconductor material layer 30P. Further, the stress-generating semiconductor material portions (44, 46) include a second stress-generating semiconductor material portion 46 that is formed on the other of the two recessed portions of the patterned semiconductor material layer 30P. The first stress-generating semiconductor material portion 44 is formed by depositing the second semiconductor material in epitaxial alignment with one of the recessed portions of the patterned semiconductor material layer 30P, and the second stress-generating semiconductor material portion 46 is formed by depositing the second semiconductor material in epitaxial alignment with the other of the recessed portions of the patterned semiconductor material layer 30P.

In one embodiment, the first stress-generating semiconductor portion 44 can be in contact with each of the plurality of fin-defining mask structures 42, and the second stress-generating semiconductor portion 46 can be in contact with each of the plurality of fin-defining mask structures 42. In one embodiment, the first stress-generating semiconductor portion 44 and the second stress-generating semiconductor portion 46 can be deposited at the same deposition rate, and the entire top surface of the first stress-generating semiconductor portion 44 and the entire top surface of the second stress-generating semiconductor portion 46 can be within the same horizontal plane.

Figure 5A:
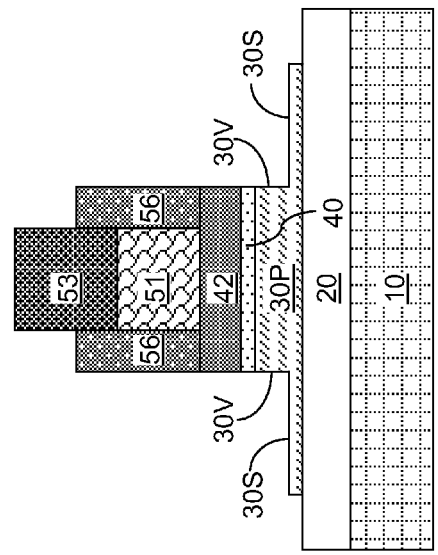
FIG. 5A is a top-down view of the first exemplary semiconductor structure after recessing portions of the patterned semiconductor material layer that are not covered by the disposable gate structure or by the gate spacer according to an embodiment of the present disclosure.
Figure 5B:
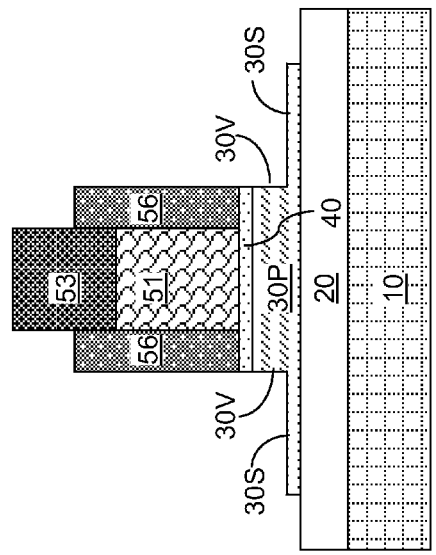
FIG. 5B is a vertical cross-sectional view of the first exemplary semiconductor structure along the vertical plane B-B' of FIG. 5A.
Figure 5D:
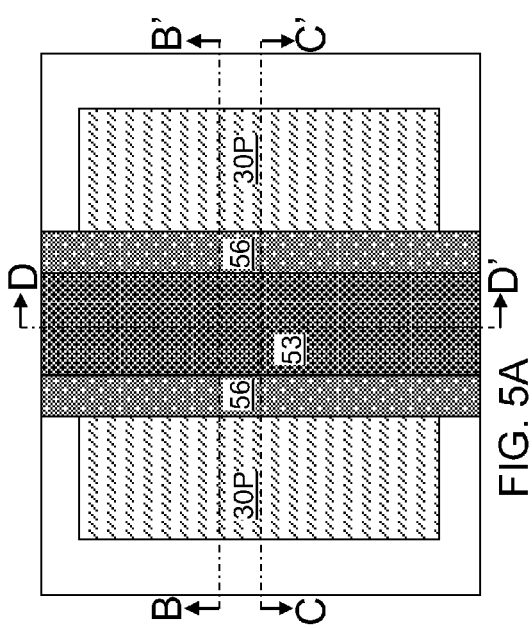
FIG. 5D is a vertical cross-sectional view of the first exemplary semiconductor structure along the vertical plane D-D' of FIG. 5A.
Figure 5C:
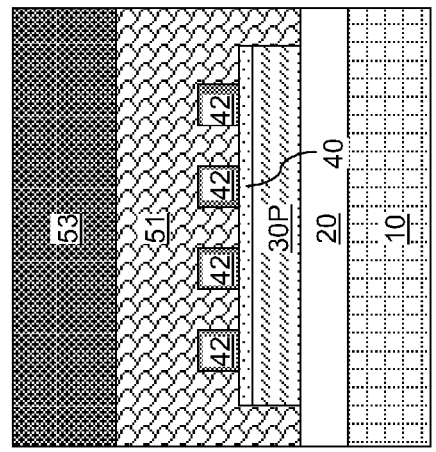
FIG. 5C is a vertical cross-sectional view of the first exemplary semiconductor structure along the vertical plane C-C' of FIG. 5A.
Figure 6A:
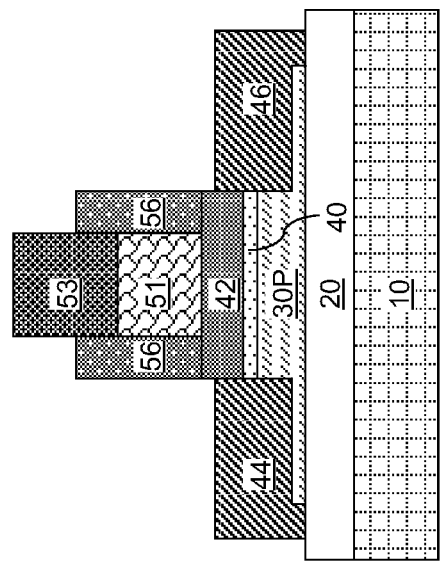
FIG. 6A is a top-down view of the first exemplary semiconductor structure after selective epitaxial growth of stress-generating semiconductor portions according to an embodiment of the present disclosure.
Figure 6B:
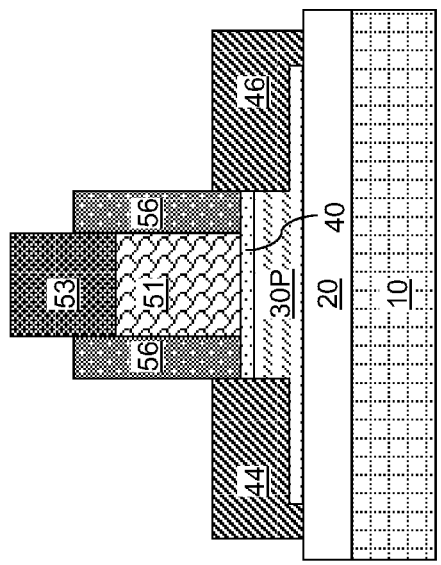
FIG. 6B is a vertical cross-sectional view of the first exemplary semiconductor structure along the vertical plane B-B' of FIG. 6A.
Figure 6D:
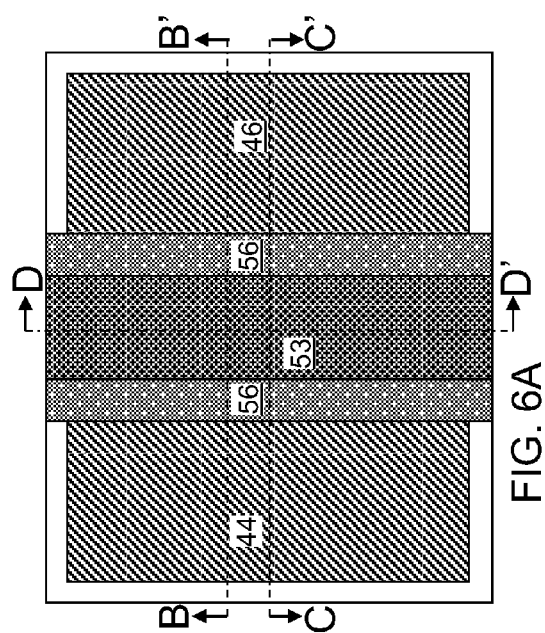
FIG. 6D is a vertical cross-sectional view of the first exemplary semiconductor structure along the vertical plane D-D' of FIG. 6A.
Figure 6C:
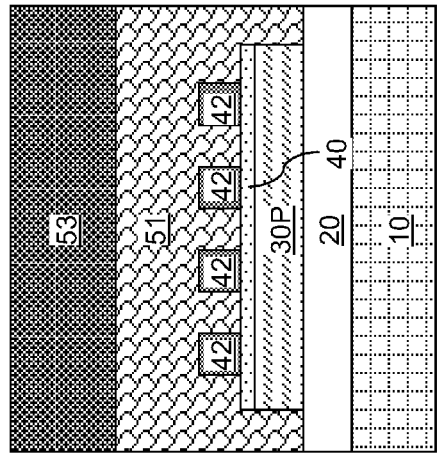
FIG. 6C is a vertical cross-sectional view of the first exemplary semiconductor structure along the vertical plane C-C' of FIG. 6A.
Figure 7B:
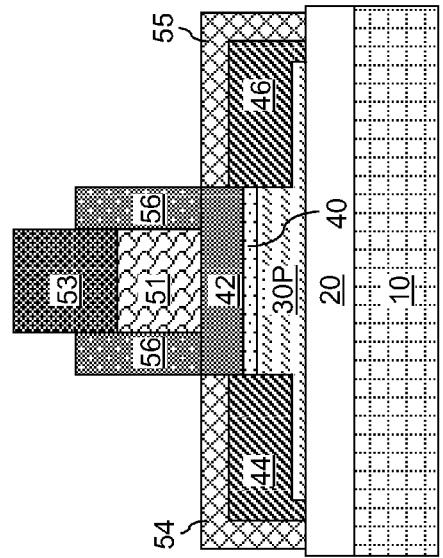
FIG. 7B is a vertical cross-sectional view of the first exemplary semiconductor structure along the vertical plane B-B' of FIG. 7A.
Figure 7C:
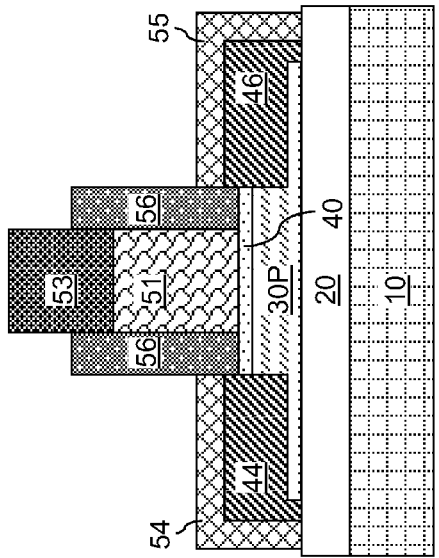
FIG. 7C is a vertical cross-sectional view of the first exemplary semiconductor structure along the vertical plane C-C' of FIG. 7A.
Figure 7A:
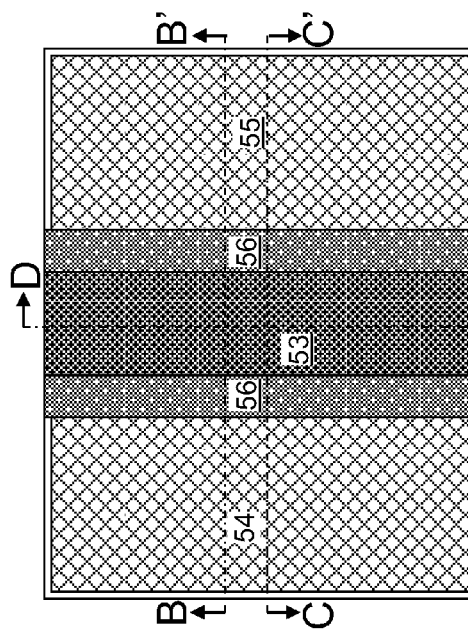
FIG. 7A is a top-down view of the first exemplary semiconductor structure after formation of metal semiconductor alloy portions according to an embodiment of the present disclosure.
Figure 7D:
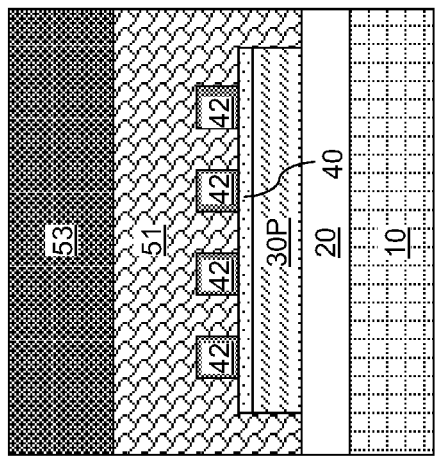
FIG. 7D is a vertical cross-sectional view of the first exemplary semiconductor structure along the vertical plane D-D' of FIG. 7A.
Figure 8B:
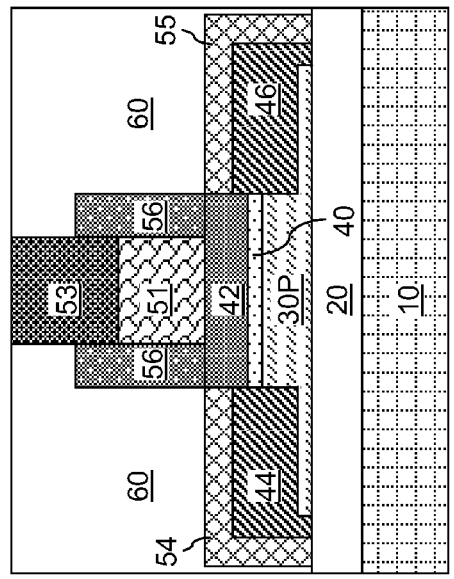
FIG. 8B is a vertical cross-sectional view of the first exemplary semiconductor structure along the vertical plane B-B' of FIG. 8A.
Figure 8C:
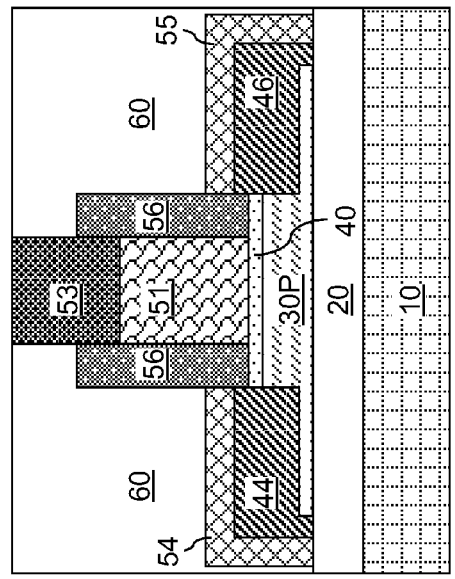
FIG. 8C is a vertical cross-sectional view of the first exemplary semiconductor structure along the vertical plane C-C' of FIG. 8A.
Figure 8A:
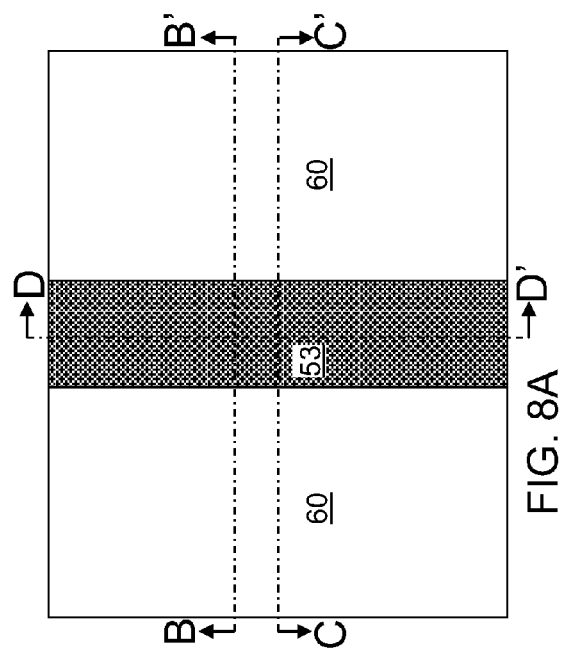
FIG. 8A is a top-down view of the first exemplary semiconductor structure after formation and planarization of a planarization dielectric layer according to an embodiment of the present disclosure.
Figure 8D:
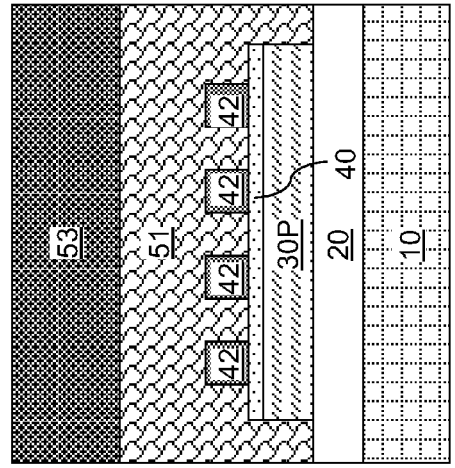
FIG. 8D is a vertical cross-sectional view of the first exemplary semiconductor structure along the vertical plane D-D' of FIG. 8A.
Figure 9B:
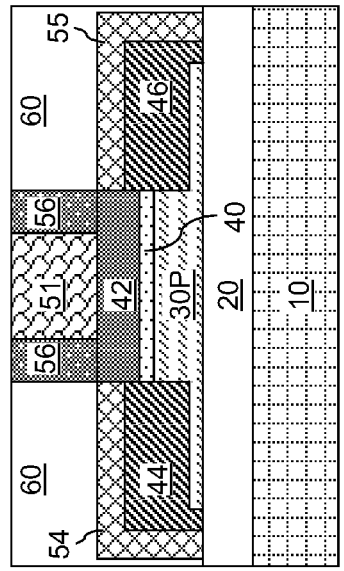
FIG. 9B is a vertical cross-sectional view of the first exemplary semiconductor structure along the vertical plane B-B' of FIG. 9A.
Figure 9C:
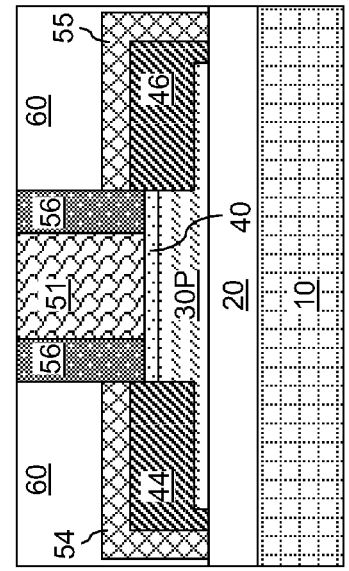
FIG. 9C is a vertical cross-sectional view of the first exemplary semiconductor structure along the vertical plane C-C' of FIG. 9A.
Figure 9A:
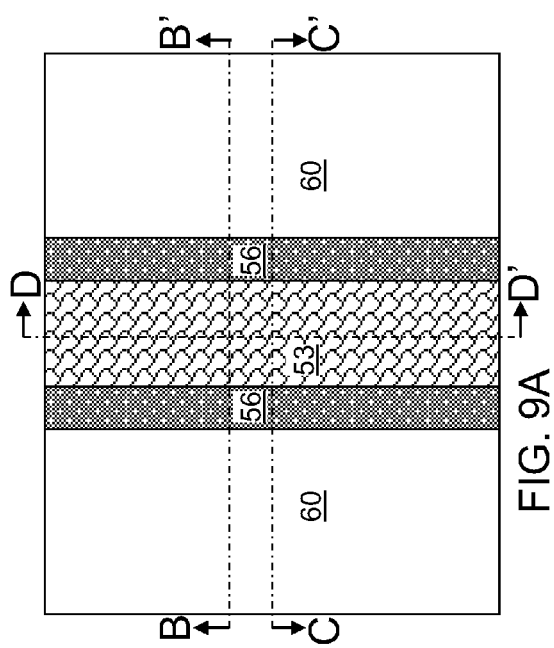
FIG. 9A is a top-down view of the first exemplary semiconductor structure after further planarization of the planarization dielectric layer and the disposable gate cap according to an embodiment of the present disclosure.
Figure 9D:
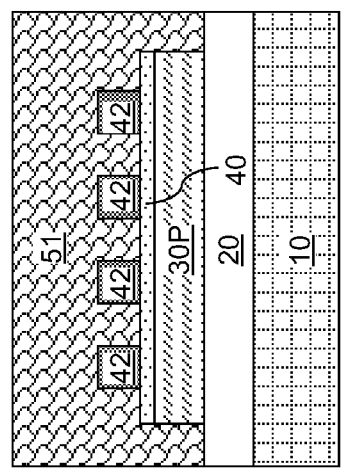
FIG. 9D is a vertical cross-sectional view of the first exemplary semiconductor structure along the vertical plane D-D' of FIG. 9A.
Figure 10B:
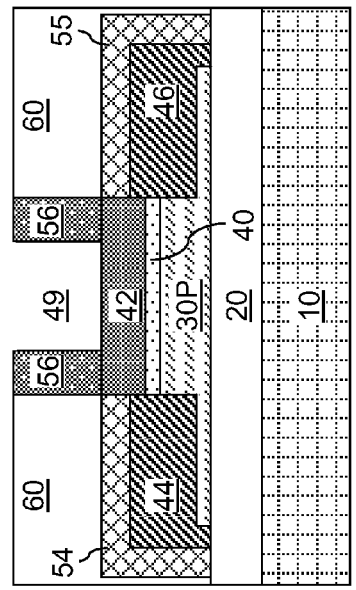
FIG. 10B is a vertical cross-sectional view of the first exemplary semiconductor structure along the vertical plane B-B' of FIG. 10A.
Figure 10C:
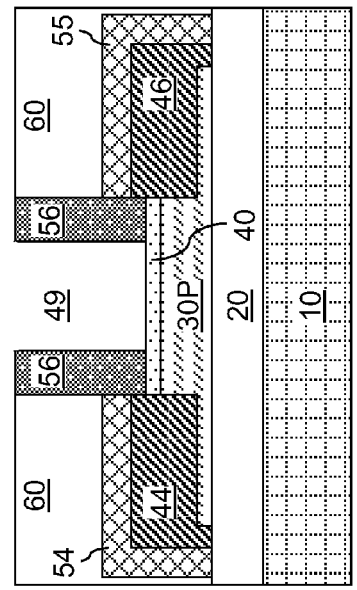
FIG. 10C is a vertical cross-sectional view of the first exemplary semiconductor structure along the vertical plane C-C' of FIG. 10A.
Figure 10A:
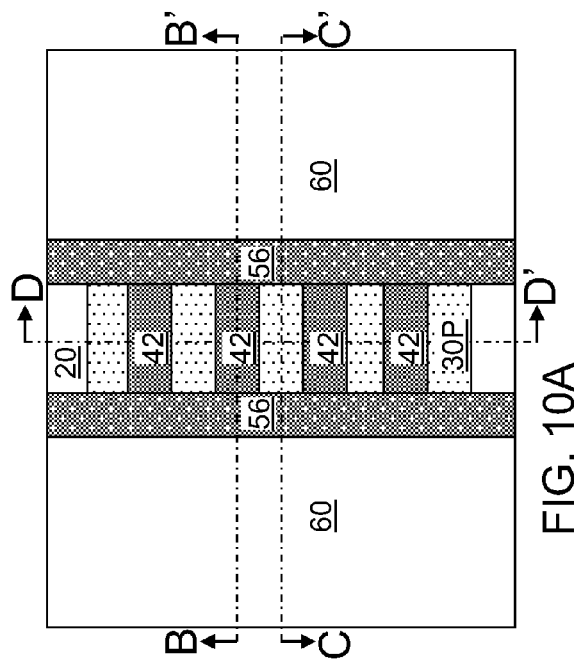
FIG. 10A is a top-down view of the first exemplary semiconductor structure after removal of the disposable gate structure according to an embodiment of the present disclosure.
Figure 10D:
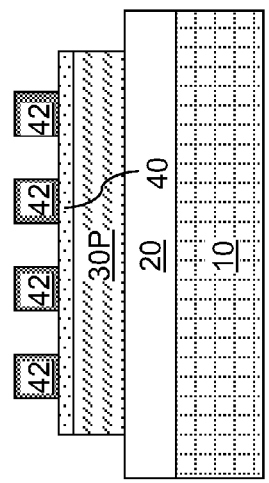
FIG. 10D is a vertical cross-sectional view of the first exemplary semiconductor structure along the vertical plane D-D' of FIG. 10A.

In one embodiment, the first stress-generating semiconductor portion 44 is formed directly on the entirety of the first vertical sidewall (i.e., one of the two vertical sidewalls 30V in FIGS. 5B and 5C), and the second stress-generating semiconductor portion 46 is formed directly on the entirety of the second vertical sidewall (i.e., another of the two vertical sidewalls 30V in FIGS. 5B and 5C).

The first stress-generating semiconductor portion 44 and the second stress-generating semiconductor portion 46 can be formed as doped semiconductor material portions by in-situ doping, or can be formed as intrinsic semiconductor material portions and subsequently doped with p-type dopants or n-type dopants by ion implantation or plasma doping. The conductivity type of the first stress-generating semiconductor portion 44 and the second stress-generating semiconductor portion 46 can be the same as the conductivity type of the source region and the drain region, which can be formed at the processing step illustrated in FIGS. 3A-3D. In one embodiment, the first semiconductor material can be silicon, and the second semiconductor material can be selected from undoped germanium, p-doped germanium, n-doped germanium, an undoped silicon germanium alloy, a p-doped silicon germanium alloy, an n-doped silicon germanium alloy, an undoped silicon carbon alloy, a p-doped silicon carbon alloy, and an n-doped silicon carbon alloy.

One of the first and second stress-generating semiconductor portions (44, 46) contacts a source region (not shown) and functions as an extended source region, and the other of the first and second stress-generating semiconductor portions (44, 46) contacts a drain region (not shown) and functions as an extended drain region.

Referring to FIGS. 7A, 7B, 7C, and 7D, various metal semiconductor alloy portions (54, 55) can be formed on the physically exposed semiconductor surfaces of the first stress-generating semiconductor portion 44 and the second stress-generating semiconductor portion 46. For example, the various metal semiconductor alloy portions (54, 55) can be formed by depositing a metal layer by physical vapor deposition (PVD) or chemical vapor deposition (CVD), and by reacting the metal layer with the underlying second semiconductor material at an elevated temperature, and subsequently removing unreacted portions of the metal layer. The various metal semiconductor alloy portions (54, 55) can include a first metal semiconductor alloy portion 54 that is formed on the first stress-generating semiconductor portion 44, and a second metal semiconductor alloy portion 55 that is formed on the second stress-generating semiconductor portion 46. If the first and second metal semiconductor alloy portions (54, 55) include silicon or a silicon-containing alloy, the first and second metal semiconductor alloy portions (54, 55).

Referring to FIGS. 8A, 8B, 8C, and 8D, a planarization dielectric layer 60 can be deposited over the disposable gate cap 53, the gate spacer 56, and the various metal semiconductor alloy portions (54, 55). The planarization dielectric layer 60 includes at least one dielectric material, which can be silicon oxide, silicon nitride, silicon oxynitride, organosilicate glass (OSG), or a combination thereof. The thickness of the planarization dielectric layer 60 can be selected so that the entirety of the top surface of the planarization dielectric layer 60 is formed above the top surface of the disposable gate cap 53.

The planarization dielectric layer 60 can be subsequently planarized, for example, by chemical mechanical planarization (CMP) and/or a recess etch. In one embodiment, the disposable gate cap 53 can be employed as a stopping layer.

Referring to FIGS. 9A, 9B, 9C, and 9D, additional portions of the planarization dielectric layer 60 and the disposable gate cap 53 can be removed by an additional planarization process, which can be performed by additional CMP and/or an additional recess etch. In one embodiment, the disposable gate structure 51 can be employed as a stopping layer. A top surface of the disposable gate structure 51 is physically exposed. The top surface of the planarization dielectric layer 60 can be a planar surface.

Referring to FIGS. 10A, 10B, 10C, and 10D, the disposable gate structure 51 can be removed selective to the plurality of fin-defining mask structures 42. If the optional dielectric pad 40 is present, the disposable gate structure 51 can be removed selective to material of the optional dielectric pad 40. If the optional dielectric pad 40 is not present, the disposable gate structure 51 can be removed selective to the first semiconductor material of the plurality of fin-defining mask structures 42. A gate cavity 49 is formed within a volume from which the disposable gate structure 51 is removed.

Referring to FIGS. 11A, 11B, 11C, and 11D, a plurality of semiconductor fins 30F can be formed by transfer of the pattern of the plurality of fin-defining mask structures 42 underneath the gate cavity 49 into the patterned semiconductor material layer 30P. The area of the plurality of semiconductor fins 30F is the intersection of the area of the plurality of fin-defining mask structures 42 and the area of the gate cavity 49 (which is the same as the area of the disposable gate structure 51).

The remaining portion of the patterned semiconductor material layer 30P constitutes a fin-containing semiconductor portion 30. The fin-containing semiconductor portion 30 includes the first semiconductor material. The fin-containing semiconductor portion 30 can include a plurality of semiconductor fins 30F, a first end portion (30P1, 30D1), and a second end portion (30P2, 30D2). Each semiconductor fin 30F among the plurality of semiconductor fins 30F is laterally spaced from each other or one another along a widthwise direction, which is perpendicular to the lengthwise direction of the plurality of semiconductor fins 30F. The lengthwise direction of the plurality of semiconductor fins 30F is the same as the lengthwise direction of the plurality of fin-defining mask structures 42.

In one embodiment, the first end portion (30P1, 30D1) is a source region, and the second end portion (30P2, 30D2) is a drain region. In this case, the first stress-generating semiconductor portion 44 functions as an extended source region, and the second stress-generating semiconductor portion 46 functions as an extended drain region. In another embodiment, the first end portion (30P1, 30D1) is a drain region, and the second end portion (30P2, 30D2) is a source region. In this case, the first stress-generating semiconductor portion 44 functions as an extended drain region, and the second stress-generating semiconductor portion 46 functions as an extended source region.

A lengthwise end of each of the plurality of semiconductor fins 30F is adjoined to the first end portion (30P1, 30D1), and another lengthwise end of each of the plurality of semiconductor fins 30F is adjoined to the second end portion (30P2, 30D2). The first end portion (30P1, 30D1) includes a first proximal portion 30P1 having the same height as the plurality of semiconductor fins 30F and a first distal portion 30D1 having a lesser height than the plurality of semiconductor fins 30F. The second end portion (30P2, 30D2) includes a second proximal portion 30P2 having the same height as the plurality of semiconductor fins 30F and a second distal portion 30D2 having a lesser height than the plurality of semiconductor fins 30F.

The first stress-generating semiconductor portion 44 is in contact with a vertical sidewall of the first proximal portion 30P1, which is the same as one of the two vertical sidewalls 30V (See FIGS. 5B and 5C). The first stress-generating semiconductor portion 44 includes the second semiconductor material, has a different lattice constant than the first semiconductor material, and is epitaxially aligned to the first semiconductor material of the first end portion (30P1, 30D1).

The second stress-generating semiconductor portion 46 is in contact with a vertical sidewall of the second proximal portion 30P2, which is the same as the other of the two vertical sidewalls 30V (See FIGS. 5B and 5C). The second stress-generating semiconductor portion 46 includes the second semiconductor material, has a different lattice constant than the first semiconductor material, and is epitaxially aligned to the first semiconductor material of the second end portion (30P2, 30D2).

Figure 11B:
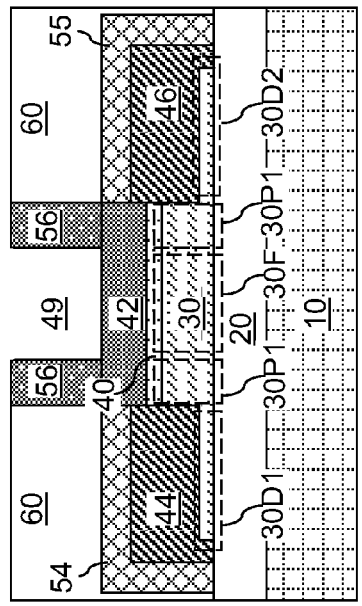
FIG. 11B is a vertical cross-sectional view of the first exemplary semiconductor structure along the vertical plane B-B' of FIG. 11A.
Figure 11C:
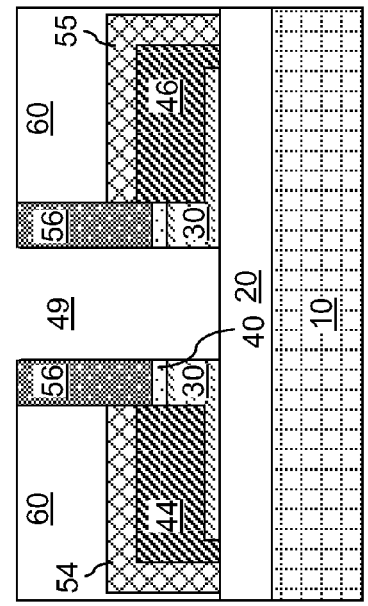
FIG. 11C is a vertical cross-sectional view of the first exemplary semiconductor structure along the vertical plane C-C' of FIG. 11A.
Figure 11A:
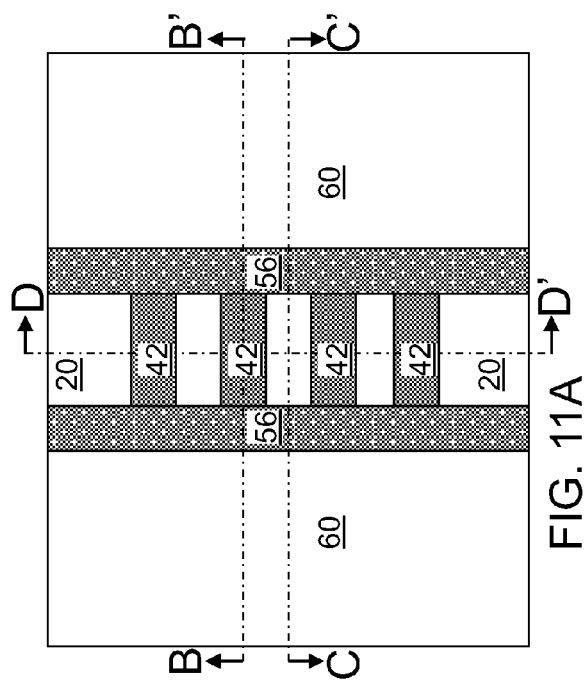
FIG. 11A is a top-down view of the first exemplary semiconductor structure after formation of a plurality of semiconductor fins by transfer of the pattern of the plurality of fin-defining mask structures into the patterned semiconductor material layer according to an embodiment of the present disclosure.
Figure 11D:
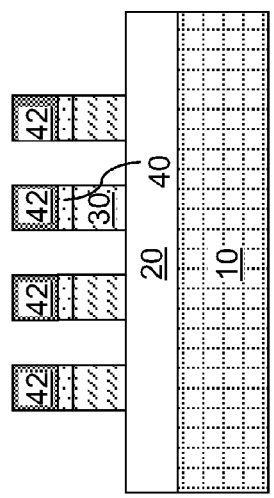
FIG. 11D is a vertical cross-sectional view of the first exemplary semiconductor structure along the vertical plane D-D' of FIG. 11A.
Figure 12B:
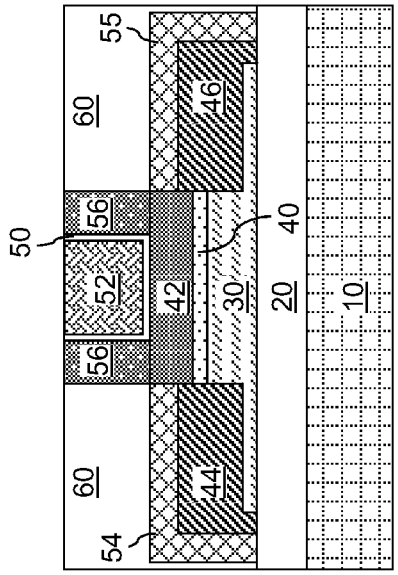
FIG. 12B is a vertical cross-sectional view of the first exemplary semiconductor structure along the vertical plane B-B' of FIG. 12A.
Figure 12C:
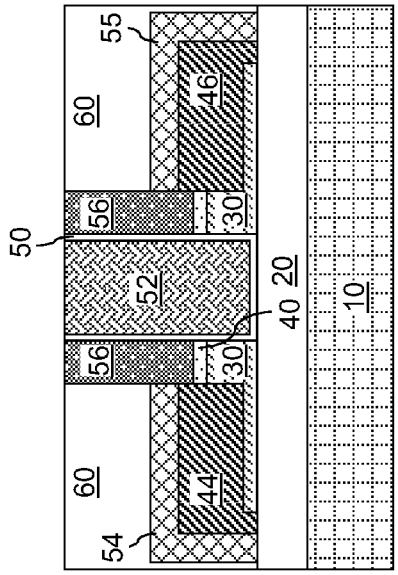
FIG. 12C is a vertical cross-sectional view of the first exemplary semiconductor structure along the vertical plane C-C' of FIG. 12A.
Figure 12A:
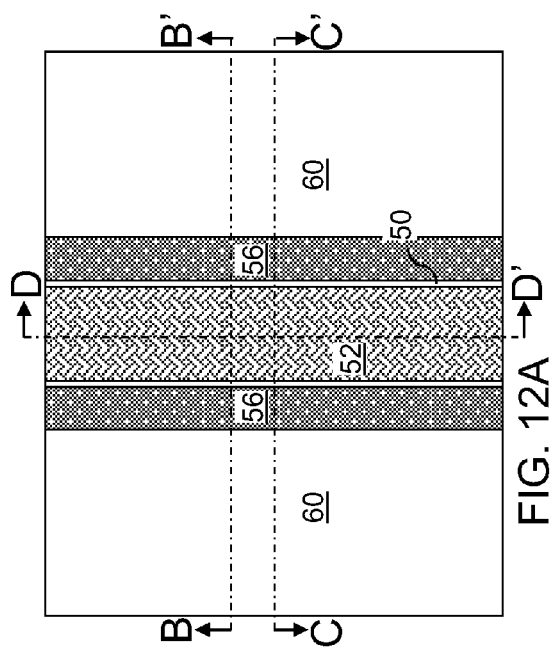
FIG. 12A is a top-down view of the first exemplary semiconductor structure after formation of a gate dielectric and a gate electrode according to an embodiment of the present disclosure.
Figure 12D:
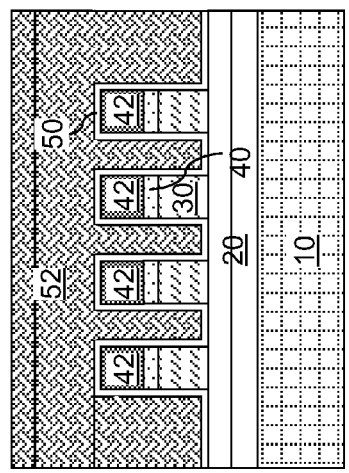
FIG. 12D is a vertical cross-sectional view of the first exemplary semiconductor structure along the vertical plane D-D' of FIG. 12A.
Figure 13B:
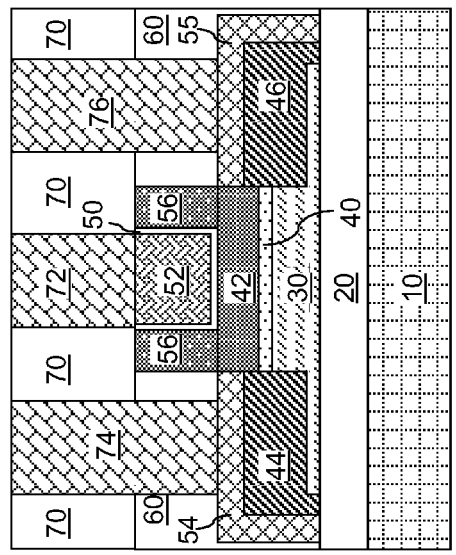
FIG. 13B is a vertical cross-sectional view of the first exemplary semiconductor structure along the vertical plane B-B' of FIG. 13A.
Figure 13C:
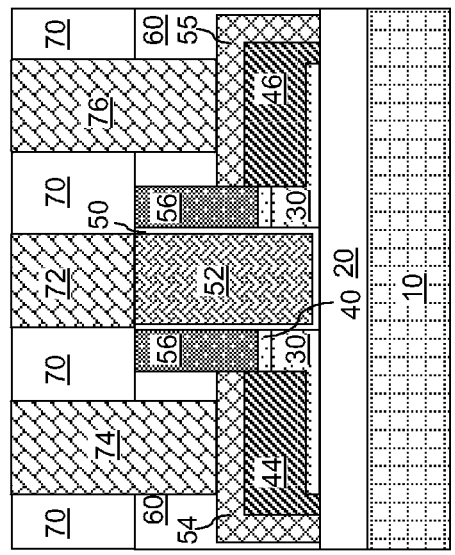
FIG. 13C is a vertical cross-sectional view of the first exemplary semiconductor structure along the vertical plane C-C' of FIG. 13A.
Figure 13A:
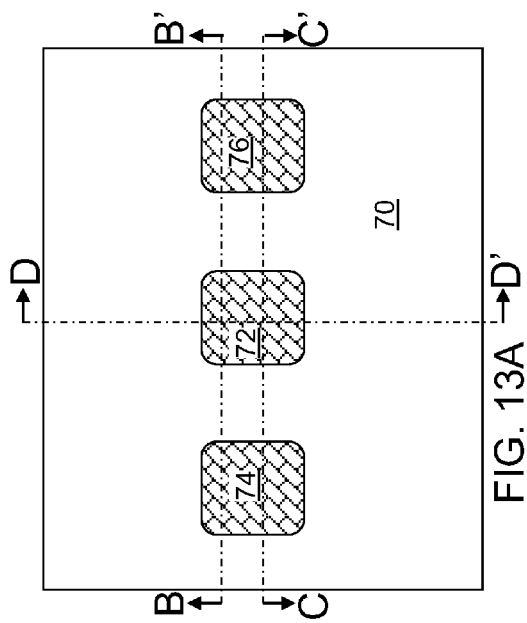
FIG. 13A is a top-down view of the first exemplary semiconductor structure after formation of various contact via structures according to an embodiment of the present disclosure.
Figure 13D:
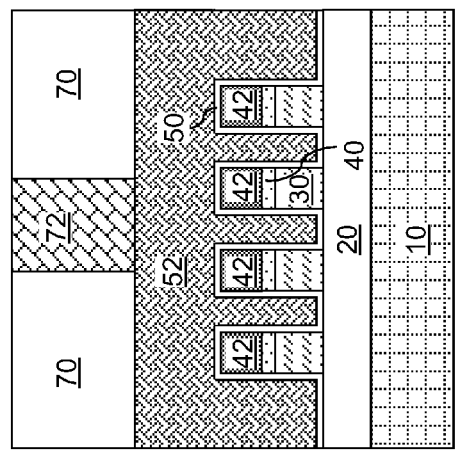
FIG. 13D is a vertical cross-sectional view of the first exemplary semiconductor structure along the vertical plane D-D' of FIG. 13A.

The first stress-generating semiconductor portion 44 is in contact with the entirety of the top surface of the first distal portion 30D1 and a sidewall surface of the first end portion (30P1, 30D1) that adjoins the top surface of the buried insulator layer 20, i.e., a sidewall surface of the first distal portion 30D1 illustrated in FIGS. 11B and 11C. The second stress-generating semiconductor portion 46 is in contact with the entirety of the top surface of the second distal portion 30D2 and a sidewall surface of the second end portion (30P2, 30D2) that adjoins the top surface of the buried insulator layer 20, i.e., a sidewall surface of the second distal portion 30D2 illustrated in FIGS. 11B and 11C.

In one embodiment, a plurality of fin-defining mask structures 42 overlies the plurality of semiconductor fins 30F, and the plurality of semiconductor fins 30F has a same width as the plurality of fin-defining mask structures 42. Some regions of the first proximal portion 30P1 underlie end portions of the plurality of fin-defining mask structures 42, and some other regions of the first proximal portion 30P1 do not underlie the plurality of fin-defining mask structures 42. Likewise, some regions of the second proximal portion 30P2 underlie end portions of the plurality of fin-defining mask structures 42, and some other regions of the second proximal portion 30P2 do not underlie the plurality of fin-defining mask structures 42.

A first gate spacer portion of the gate spacer 56 contacts the first end portion (30P1, 30D1), and has the same thickness as the lateral extent of the first proximal portion 30P1 along the lengthwise direction of the plurality of semiconductor fins 30F. A second gate spacer portion of the gate spacer 56 contacts the second end portion (30P2, 30D2), and has the same thickness as the lateral extent of the second proximal portion 30P2 along the lengthwise direction of the plurality of semiconductor fins 30F.

In one embodiment, the bottom surface of the fin-containing semiconductor portion 30 laterally extends from a sidewall of the first distal portion 30P1 to a sidewall of the second distal portion 30P2, and the entirety of the bottom surface of the fin-containing semiconductor portion 30 is in contact with the planar top surface of the buried insulator layer 20.

Referring to FIGS. 12A, 12B, 12C, and 12D, a gate dielectric 50 and a gate electrode 52 can be formed within the gate cavity 49. The gate dielectric 50 can be formed directly on each lengthwise sidewall of the plurality of semiconductor fins 30F. The gate dielectric 50 can be formed as a single contiguous layer, for example, by deposition of a dielectric material by chemical vapor deposition (CVD) or atomic layer deposition (ALD), or can be formed by a set of non-contiguous material portions that are formed only on lengthwise sidewalls of the plurality of semiconductor fins 30F, for example, by conversion of surface portions of the first semiconductor material of the plurality of semiconductor fins 30F into a dielectric material such as silicon oxide, silicon nitride, or silicon oxynitride.

The gate electrode 52 can be formed by filling the gate trench with at least one conductive material such as at least one metallic material and/or at least one doped semiconductor material. The gate electrode 52 overlies the plurality of semiconductor fins 42, and is in contact with the gate dielectric 50. The portion of the at least one conductive material above the top surface of the planarization dielectric layer 60 can be removed, for example, by chemical mechanical planarization. The portion of the gate dielectric 50, if formed above the top surface of the planarization dielectric layer 60, may, or may not, be subsequently removed.

Referring to FIGS. 13A, 13B, 13C, and 13D, a contact level dielectric material layer 70 can be formed by depositing a dielectric material, which can include, for example, silicon oxide, silicon nitride, silicon oxynitride, and/or porous or non-porous organosilicate glass (OSG). Various contact via structures can be formed to provide electrical contact with various components of a fin field effect transistor, which includes a plurality of channels within the plurality of semiconductor fins 30F. The various contact via structures can include, for example, a gate contact via structure 72 that contacts the gate electrode 52, a first source/drain contact via structure 74 that contacts the first metal semiconductor alloy portion 54 or the first stress-generating semiconductor portion 44, and a second source/drain contact via structure 76 that contacts the second metal semiconductor alloy portion 55 or the second stress-generating semiconductor portion 46.

Figure 14:
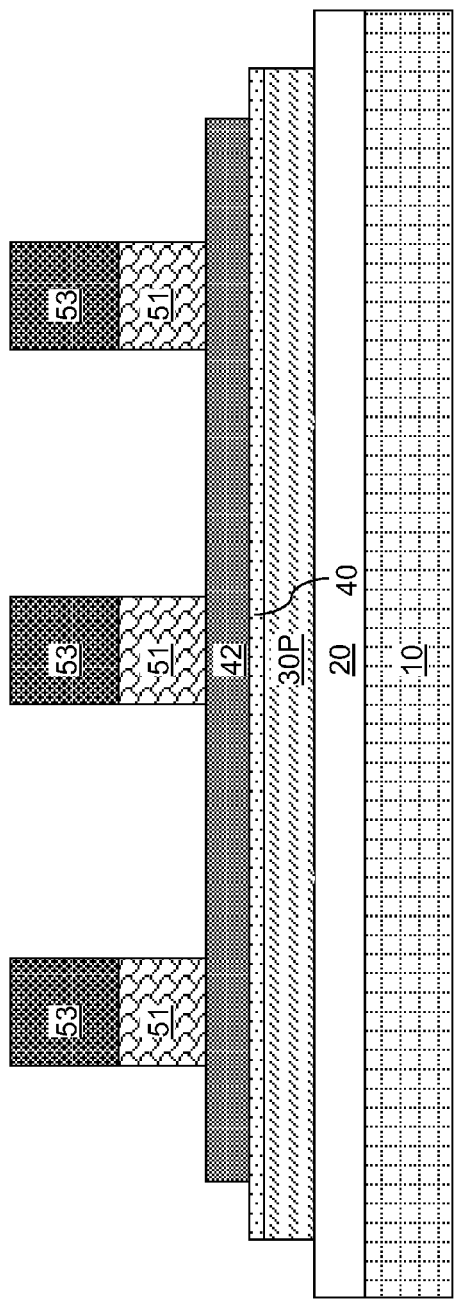
FIG. 14 is a vertical cross-sectional view of a second exemplary semiconductor structure after formation of a plurality of disposable gate structures and disposable gate caps according to an embodiment of the present disclosure.

Referring to FIG. 14, a second exemplary semiconductor structure can be derived from the first exemplary structure of FIGS. 2A, 2B, 2C, and 2D by forming a plurality of disposable gate structures 51 and disposable gate caps 53 over the patterned semiconductor material layer 30P. The processing steps of FIGS. 3A, 3B, 3C, and 3D can be employed with modification of a pattern for patterning the disposable gate material layer (not shown) and the disposable gate cap layer (not shown).

Figure 15:
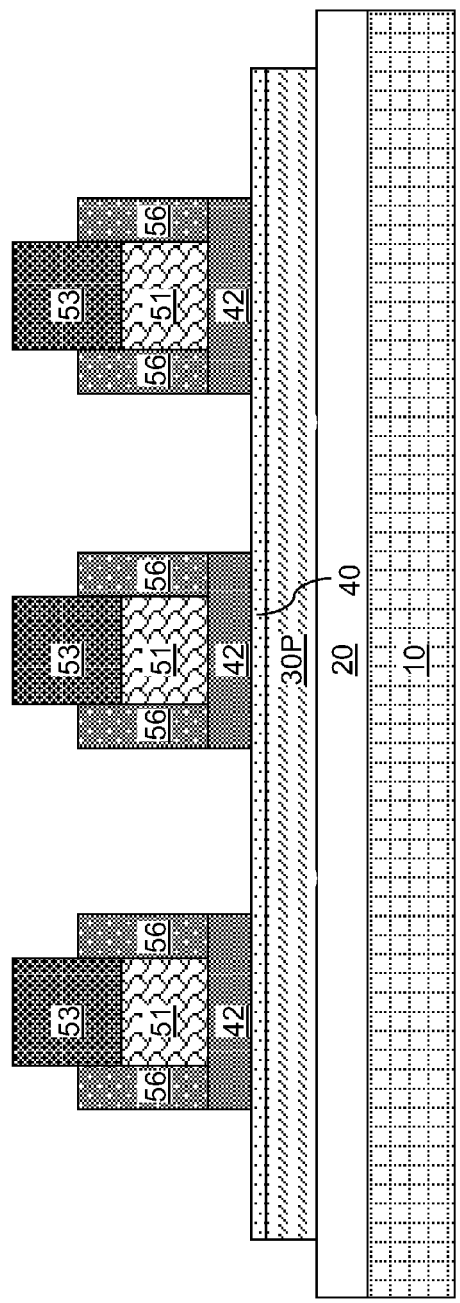
FIG. 15 is a vertical cross-sectional view of the second exemplary semiconductor structure after formation of a plurality of gate spacers and removal of portions of the plurality of fin-defining mask structures that are not covered by the disposable gate structures or by the gate spacers according to an embodiment of the present disclosure.

Referring to FIG. 15, the processing steps of FIGS. 4A, 4B, 4C, and 4D are performed to form gate spacers 56 and to remove portions of the plurality of fin-defining mask structures 42 that are not covered by the disposable gate structures 51 or by the gate spacer 56.

Figure 16:
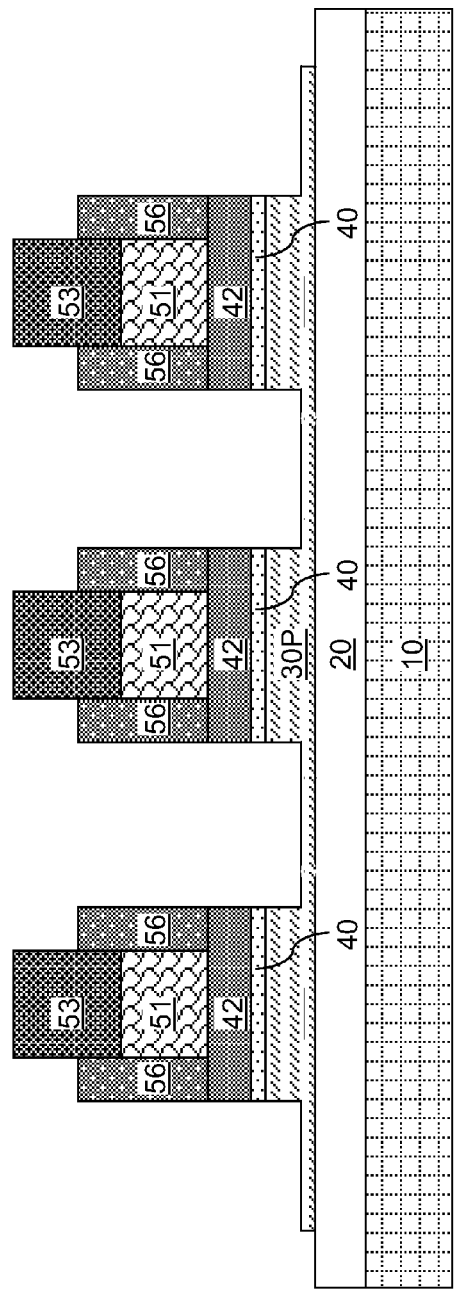
FIG. 16 is a vertical cross-sectional view of the second exemplary semiconductor structure after recessing portions of the patterned semiconductor material layer that are not covered by the disposable gate structure or by the gate spacer according to an embodiment of the present disclosure.

Referring to FIG. 16, portions of the patterned semiconductor material layer 30P that are not covered by the disposable gate structures 51 or by the gate spacers 56 are recessed employing the processing steps of FIGS. 5A, 5B, 5C, and 5D. Some of the recessed regions of the patterned semiconductor material layer 30P can have a first sidewall that is vertically coincident with an outer sidewall of a first gate spacer 56 and a second sidewall that is vertically coincident with an outer sidewall of a second gate spacer 56, i.e., laterally bounded by a pair of gate spacers 56.

Figure 17:
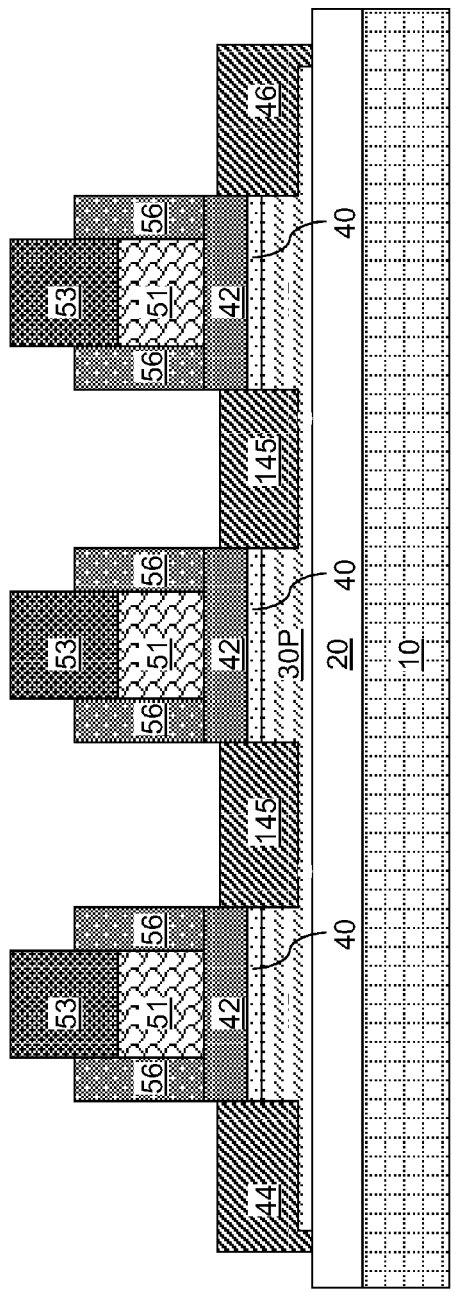
FIG. 17 is a vertical cross-sectional view of the second exemplary semiconductor structure after selective epitaxial growth of stress-generating semiconductor portions according to an embodiment of the present disclosure.

Referring to FIG. 17, stress-generating semiconductor portions are formed by selective epitaxial growth employing the processing steps of FIGS. 6A, 6B, 6C, and 6D. The stress-generating semiconductor portions can include, for example, a first stress-generating semiconductor portion 44, a second stress-generating semiconductor portion 46, and additional stress-generating semiconductor portions 145 that are embedded within the stack of the patterned semiconductor material layer 30P, the optional dielectric pads 40, and the plurality of fin-defining mask structures 42. The additional stress-generating semiconductor portions 145 are fully embedded stress-generating semiconductor portions that do not any have free-standing lateral surface, i.e., all lateral surfaces of the additional stress-generating semiconductor portions 145 are laterally contacted by a material portion, thereby preventing stress relaxation in lateral directions through volume changes. Thus, the effectiveness of the additional stress-generating semiconductor portions 145 is enhanced for the purpose of generating a lateral stress, i.e., for the purpose of applying a lateral stress to channels of fin field effect transistors.

Each of the additional stress-generating semiconductor portions 145 can be formed as a portion of a source region, as a portion of a drain region, or as a portion of a common node that functions as a source region for one fin field effect transistor and as a drain region for another adjoining fin field effect transistor, or as a portion of a variable functionality node that functions as a source region in one operational mode and as a drain region in another operational mode.

Referring to FIGS. 18A and 18B, the processing steps of FIGS. 7A-7D are performed to form a first metal semiconductor alloy portion 54, a second metal semiconductor alloy portion 55, and additional metal semiconductor alloy portions 155 on the physically exposed semiconductor surfaces of the first stress-generating semiconductor portion 44, the second stress-generating semiconductor portion 46, and the additional second stress-generating semiconductor portions 145. Subsequently, additional processing steps of FIGS. 8A-8D, 9A-9D, 10A-10D, 11A-11D, 12A-12D, and 13A-13D can be performed. Various contact structures that include gate contact via structures 72 contacting the gate electrodes 52, a first source/drain contact via structure 74 contacting the first metal semiconductor alloy portion 54 or the first stress-generating semiconductor portion 44, a second source/drain contact via structure 76 contacting the second metal semiconductor alloy portion 55 or the second stress-generating semiconductor portion 46, and additional source/drain contact via structures 75 contacting the additional metal semiconductor alloy portions 155 or the additional stress-generating semiconductor portions 145 are thus formed.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
    forming a plurality of fin-defining mask structures over a semiconductor material layer comprising a first semiconductor material;
    forming a disposable gate structure and a gate spacer over a middle portion of each of said plurality of fin-defining mask structures;
    recessing portions of said semiconductor material layer that are not covered by said disposable gate structure or by said gate spacer;
    forming a first stress-generating semiconductor portion and a second stress-generating semiconductor portion on said recessed portions of said semiconductor material layer, each of said first stress-generating semiconductor portion and said second stress-generating semiconductor portion comprises a second semiconductor material that is different from said first semiconductor material;
    removing said disposable gate structure to form a gate cavity; and
    forming a plurality of semiconductor fins within said gate cavity, after removing said disposable gate structure, by etching portions of said semiconductor material layer that are not covered by said plurality of fin-defining mask structures, said gate spacer, said first stress-generating semiconductor portion and said second stress-generating semiconductor portion.

2. The method of claim 1, wherein forming of said first stress-generating semiconductor material portion comprises depositing said second semiconductor material in epitaxial alignment with one of said recessed portions of said semiconductor material layer, and said forming of said second stress-generating semiconductor material portion comprises depositing said second semiconductor material in epitaxial alignment with another of said recessed portions of said semiconductor material layer.

3. The method of claim 2, wherein said semiconductor material layer is provided as a top semiconductor layer of a semiconductor-on-insulator (SOI) layer including a buried insulator layer, and each of said recessed portions of said semiconductor material layer include a vertical sidewall that is vertically coincident with a sidewall of said gate spacer.

4. The method of claim 3, wherein each of said recessed portions has a planar recessed surface that is located below a plane of a topmost surface of said semiconductor material layer and above an interface between said semiconductor material layer and said buried insulator layer.

5. The method of claim 4, wherein said planar recessed surface overlies an entirety of one of said recessed portions.

6. The method of claim 4, wherein a first sidewall and a second sidewall are formed on said semiconductor material layer by said recessing of said portions of said, wherein said first stress-generating semiconductor portion is formed directly on an entirety of said first sidewall, and said second stress-generating semiconductor portion is formed directly on an entirety of said second sidewall.

7. The method of claim 1, wherein said forming of said gate spacer comprises:
    depositing a conformal dielectric material layer on said disposable gate structure and over said plurality of fin-defining mask structures; and
    etching vertical portions of said conformal dielectric material layer and portions of said plurality of fin-defining mask structures that are not covered by said disposable gate structure or by vertical portions of said conformal dielectric material layer.

8. The method of claim 7, wherein said conformal dielectric material layer and said fin-defining mask structures comprise a same dielectric material.

9. The method of claim 1, further comprising:
forming a gate dielectric directly on a lengthwise sidewall of said plurality of semiconductor fins; and
forming a gate electrode on said gate dielectric.

10. The method of claim 1, wherein said first semiconductor material is silicon, and said second semiconductor material is selected from undoped germanium, p-doped germanium, n-doped germanium, an undoped silicon germanium alloy, a p-doped silicon germanium alloy, an n-doped silicon germanium alloy, an undoped silicon carbon alloy, a p-doped silicon carbon alloy, and an n-doped silicon carbon alloy.

11. The method of claim 1, further comprising forming a first metal semiconductor alloy portion on said first stress-generating semiconductor portion and a second metal semiconductor alloy portion on said second stress-generating semiconductor portion.

12. The method of claim 11, further comprising forming a planarization dielectric layer over said disposable gate structure, said gate spacer, said first metal semiconductor alloy portion, and said second metal semiconductor alloy portion.

13. The method of claim 12, further comprising forming a contact level dielectric layer over said planarization dielectric layer, and a gate dielectric and a gate electrode located within said gate cavity.

14. The method of claim 13, further comprising forming a gate contact via structure that contacts said gate electrode, a first source/drain contact via structure that contacts said first metal semiconductor alloy portion, and a second source/drain contact via structure that contacts said second metal semiconductor alloy portion.

* * * * *